United States Patent
Zhang et al.

(10) Patent No.: US 12,543,316 B2
(45) Date of Patent: Feb. 3, 2026

(54) MEMORY DEVICE WITH WORD LINES AND CONTACT LANDING

(71) Applicant: Yangtze Memory Technologies Co., Ltd., Hubei (CN)

(72) Inventors: Zhong Zhang, Wuhan (CN); Di Wang, Wuhan (CN); Wenxi Zhou, Wuhan (CN)

(73) Assignee: Yangtze Memory Technologies Co., Ltd., Hubei (CN)

( * ) Notice: Subject to any disclaimer, the term of this patent is extended or adjusted under 35 U.S.C. 154(b) by 390 days.

(21) Appl. No.: 18/296,161

(22) Filed: Apr. 5, 2023

(65) Prior Publication Data

US 2024/0298443 A1    Sep. 5, 2024

Related U.S. Application Data

(63) Continuation of application No. PCT/CN2023/079337, filed on Mar. 2, 2023.

(51) Int. Cl.
*H10B 43/27*   (2023.01)
*H10B 41/27*   (2023.01)

(52) U.S. Cl.
CPC ............ *H10B 43/27* (2023.02); *H10B 41/27* (2023.02)

(58) Field of Classification Search
None
See application file for complete search history.

(56) References Cited

U.S. PATENT DOCUMENTS

| | | | | |
|---|---|---|---|---|
| 2018/0366476 | A1* | 12/2018 | Liu | G11C 11/2273 |
| 2022/0399285 | A1* | 12/2022 | Zhang | H01L 21/76816 |
| 2023/0067727 | A1* | 3/2023 | Wang | H01L 24/08 |
| 2023/0292499 | A1* | 9/2023 | Zhang | H10B 12/09 |

FOREIGN PATENT DOCUMENTS

| | | |
|---|---|---|
| CN | 111819690 | 5/2021 |
| CN | 115036290 | 9/2022 |
| CN | 115101530 | 9/2022 |

OTHER PUBLICATIONS

International Search Report and Written Opinion in International Appln. No. PCT/CN2023/079337, mailed on Oct. 10, 2023, 15 pages.

* cited by examiner

*Primary Examiner* — Alexander G Ghyka
(74) *Attorney, Agent, or Firm* — Fish & Richardson P.C.

(57) ABSTRACT

A method of memory device fabrication includes, providing a structure that includes first layers including word lines interleaved respectively with first dielectric layers, second layers including second dielectric layers interleaved respectively with the first dielectric layers, wherein the second layers are adjacent to the first layers, forming vertical recesses each of which extend to a surface of a respective one of the second dielectric layers in a first direction through the second layers, etching a respective lateral recess to expose a surface of a respective one of the word lines, and filling each respective lateral recess with at least one conductive material, such that the at least one conductive material in the respective lateral recess is in contact with the respective one of the word lines through the exposed surface.

13 Claims, 10 Drawing Sheets

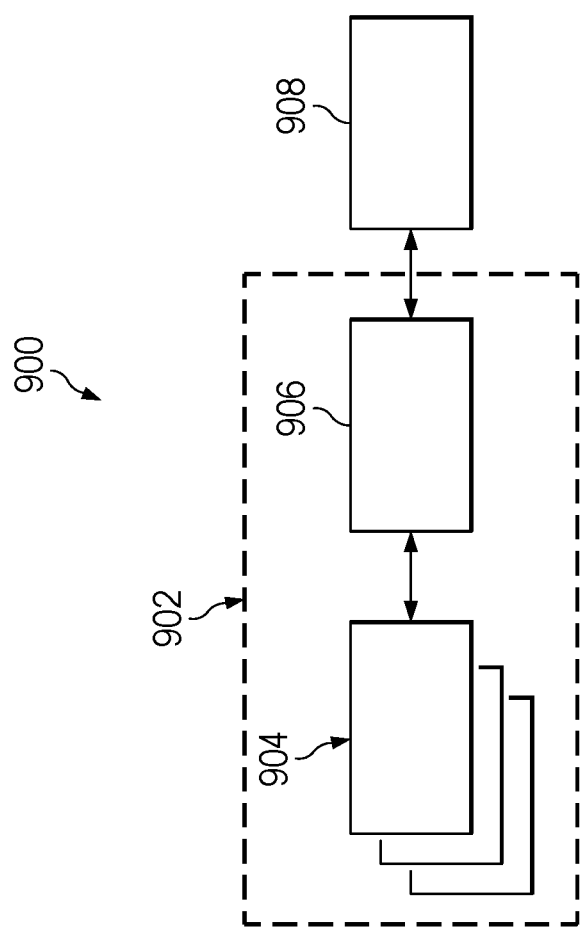

MEMORY DEVICE WITH WORD LINES AND CONTACT LANDING

CROSS-REFERENCE TO RELATED APPLICATIONS

This application is a continuation of International Application No. PCT/CN2023/079337, filed on Mar. 2, 2023, the disclosure of which is hereby incorporated by reference in its entirety.

TECHNICAL FIELD

The present disclosure relates to three-dimensional (3D) memory devices and fabrication methods thereof.

BACKGROUND

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit. A 3D memory architecture can address the density limitation in planar memory cells. The 3D memory architecture includes a memory array and peripheral devices for controlling signals to and from the memory array.

SUMMARY

This specification describes three-dimensional (3D) memory devices and methods of fabrication.

In one aspect, a method of memory device fabrication includes providing a structure that includes first layers including word lines interleaved respectively with first dielectric layers, second layers including second dielectric layers interleaved respectively with the first dielectric layers, wherein the second layers are adjacent to the first layers, forming vertical recesses each of which extend to a surface of a respective one of the second dielectric layers in a first direction through the second layers, etching a respective lateral recess to expose a surface of a respective one of the word lines, and filling each respective lateral recess with at least one conductive material, such that the at least one conductive material in the respective lateral recess is in contact with the respective one of the word lines through the exposed surface.

In some implementations, etching the respective lateral recess in each of the second dielectric layers further exposes a bottom surface of a respective one of the first dielectric layers immediately above a respective one of the second dielectric layers and a top surface of a respective one of the first dielectric layers immediately below the respective one of the second dielectric layers.

In some implementations, the word lines are at least partially circumscribed by respective high dielectric constant gate dielectric (high-k) layers, and etching the respective lateral recess includes etching at least a portion of the respective one of the second dielectric layers and at least a portion of a respective one of the high-k layers to expose the surface of the respective one of the word lines.

In some implementations, etching the respective lateral recess in each of the second dielectric layers is performed by passing a wet etching agent through a respective one of the vertical recesses to etch the at least a portion of the respective one of the second dielectric layers and the at least a portion of the respective one of the high-k layers.

In some implementations, the wet etching agent is phosphoric acid.

In some implementations, etching the respective lateral recess to expose a surface of a respective one of the word lines includes etching at least a portion of the respective one of the word lines to expose a surface of a remaining portion of the respective one of the word lines.

In another aspect, a memory device includes first layers including word lines interleaved respectively with first dielectric layers, at least one gate line structure penetrating through the first layers, second layers including second dielectric layers interleaved respectively with the first dielectric layers, where the second layers are sandwiched in the first layers, and word line pick-up structures each of which comprises a vertical contact extending through the second layers and an interconnect line connecting to the vertical contact, where each interconnect line extends from a closest gate line structure of the at least one gate line structure in a direction of and is in contact with a different one of the word lines, and where at least a portion of each of the word lines is at least partially circumscribed by high dielectric constant gate dielectric (high-k) material and the interconnect line is not circumscribed by the high-k material.

In some implementations, the at least a portion of the different one of the word lines that is partially circumscribed by the high-k material is located on a different side of the closest gate line structure with the word line pick-up structures, and where a remainder portion of the different one of the word lines is in contact with a respective interconnect line and located on a same side of the closest gate line structure with the word line pick-up structures.

In some implementations, at least a portion of the respective interconnect line is sandwiched between the remainder portion of the different one of the word lines and a respective one of the first dielectric layers.

In some implementations, the different one of the word lines in contact with a respective interconnect line is located on a different side of the closest gate line structure with the word line pick-up structures.

In some implementations, a thickness of each of the first dielectric layers are substantially the same.

In some implementations, each interconnect line has substantially a same thickness as a respective one of the second dielectric layers it is in contact with.

In some implementations, the second dielectric layers are sacrificial layers.

In some implementations, the word line pick-up structures and the word lines comprise a same conductive material.

In some implementations, word line pick-up structures comprise one or more conductive materials, and wherein the one or more conductive materials comprise a material of the word lines.

In some implementations, each of the first dielectric layers comprises oxide material and each of the second dielectric layers comprises nitride material.

In still another aspect, a system includes a memory device configured to store data, the memory device including, first layers including word lines interleaved respectively with first dielectric layers, at least one gate line structure penetrating through the first layers, second layers including second dielectric layers interleaved respectively with the first dielectric layers, wherein the second layers are sandwiched in the first layers, and word line pick-up structures each of which comprises a vertical contact extending through the second layers and an interconnect line connecting to the vertical contact, where each interconnect line extends from a closest gate line structure of the at least one gate line structure in a direction of and is in contact with a different one of the word lines, and where at least a portion of each of the word lines is at least partially circumscribed by high dielectric constant gate dielectric (high-k) material and the interconnect line is not circumscribed by the high-k material, and a memory controller that electrically connects to and controls the memory device.

In some implementations, the at least a portion of the different one of the word lines that is partially circumscribed by the high-k material is located on a different side of the closest gate line structure with the word line pick-up structures, and where a remainder portion of the different one of the word lines is in contact with a respective interconnect line and located on a same side of the closest gate line structure with the word line pick-up structures.

In some implementations, at least a portion of the respective interconnect line is sandwiched between the remainder portion of the different one of the word lines and a respective one of the first dielectric layers.

In some implementations, the different one of the word lines in contact with a respective interconnect line is located on a different side of the closest gate line structure with the word line pick-up structures.

In some implementations, a thickness of each of the first dielectric layers are substantially the same.

In some implementations, each interconnect line has substantially a same thickness as a respective one of the second dielectric layers it is in contact with.

In some implementations, the second dielectric layers are sacrificial layers.

In some implementations, the word line pick-up structures and the word lines include a same conductive material.

In some implementations, word line pick-up structures include one or more conductive materials, and where the one or more conductive materials include a material of the word lines.

In some implementations, each of the first dielectric layers include oxide material and each of the second dielectric layers include nitride material.

The foregoing and other embodiments can each optionally include one or more of the following features, alone or in combination. One embodiment, in particular, includes all the following features in combination.

Some implementations provide one or more of the following advantages. For example, in some implementations, merging the staircase structure and word line contact into a single word line pick structure in one process reduces the cost of manufacturing 3D memory devices and simplifies the manufacturing process. By replacing staircase structures and word line contacts with word line pick-structures, the scope of the gate replacement process can be reduced in some cases, such that at least some of the dummy channel structures can be eliminated so as to further reduce the cost and simplify the process.

The details of one or more embodiments of the subject matter of this specification are set forth in the accompanying drawings and the description below. Other features, aspects, and advantages of the subject matter will become apparent from the description, the drawings, and the claims.

BRIEF DESCRIPTION OF THE DRAWINGS

The accompanying drawings, which are incorporated herein and form a part of the specification, illustrate aspects of the present disclosure and, together with the description, further serve to explain the principles of the present disclosure and to enable a person of ordinary skill in the pertinent art to make and use the present disclosure.

FIG. 9 illustrates a block diagram of an example system having a 3D memory device.

The present disclosure will be described with reference to the accompanying drawings. Like reference numbers and designations in the various drawings indicate like elements.

DETAILED DESCRIPTION

Figure 1:
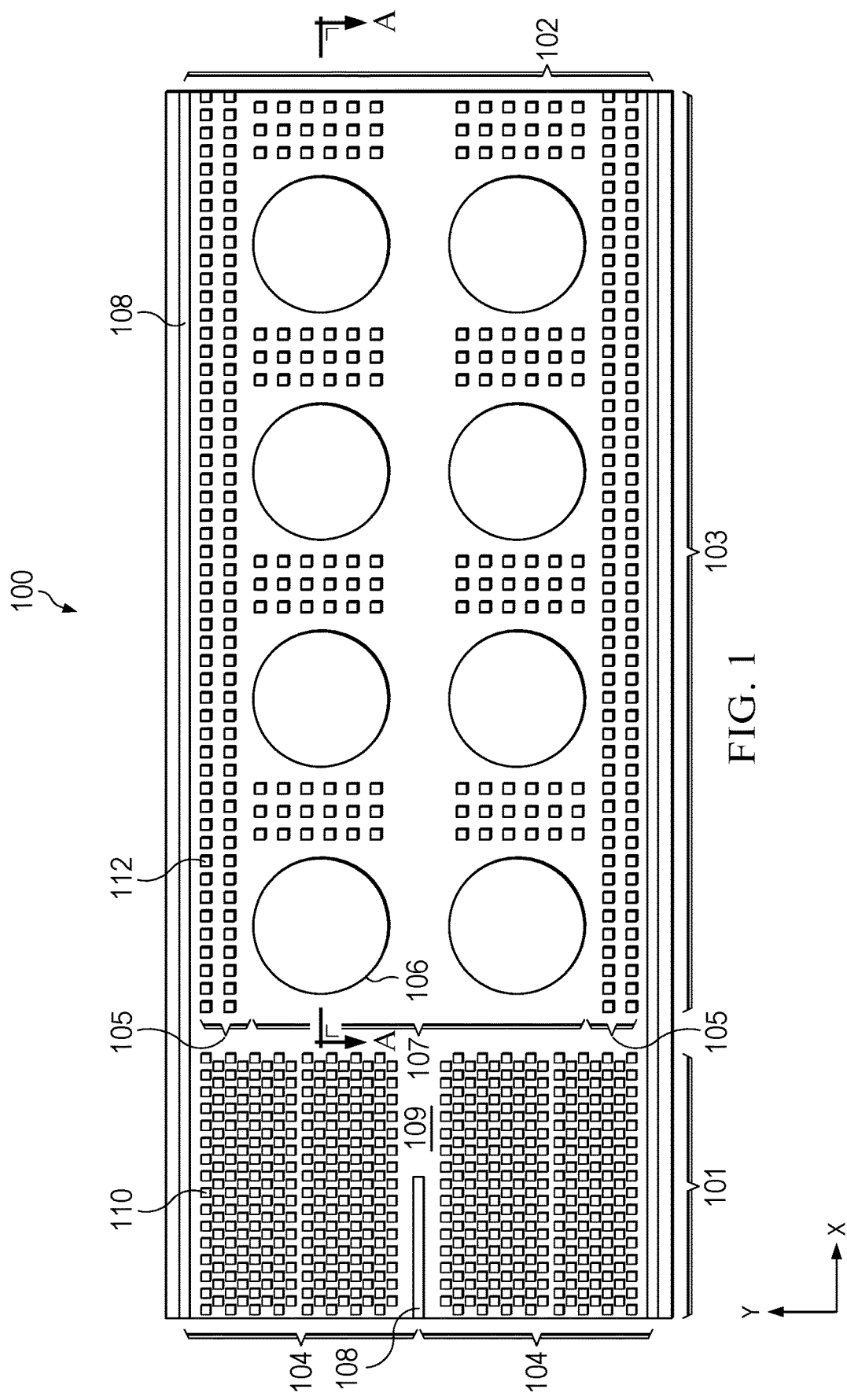
FIG. 1 illustrates a plan view of a 3D memory device having word line pick-up structures, according to some aspects of the present disclosure.

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosures can be combined, adjusted, and modified with one another and in ways not specifically depicted in the drawings, such that these combinations, adjustments, and modifications are within the scope of the present disclosure.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Furthermore, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layers thereupon, thereabove, and/or therebelow. A layer can include multiple layers. For example, an interconnect layer can include one or more conductors and contact layers (in which interconnect lines and/or vertical contacts are formed) and one or more dielectric layers.

In some 3D memory devices, such as 3D NAND memory devices, memory cells for storing data are vertically stacked through a stack structure (e.g., a memory stack) in vertical channel structures. 3D memory devices usually include staircase structures formed on one or more sides (edges), or at the center, of the stacked storage structure for purposes such as word line pick-up/fan-out using word line contacts landed onto different steps/levels of a staircase structure. Dummy channel structures are usually formed through the memory stack in regions outside of the core array region in which the channel structures of 3D NAND memory devices are formed, such as staircase regions having the staircase structures, to provide mechanical support to the stack structure, in particular, during the gate replacement process that temporarily removes some layers of the stack structure through slit openings across the core array region and staircase regions of the stack structure.

The integration of the various structures, such as dummy channel structures, word lien contacts, staircase structures, slit openings, etc., from both the device design perspective and the fabrication process perspective, has become more and more challenging as the memory cell density of the 3D NAND memory devices continues increasing.

To address one or more of the aforementioned issues, the present disclosure introduces a solution that achieves the word line pick-up/fan-out functions without using staircase structures and word line contacts. The present disclosure can use a relatively simple single process of making word line pickup structures to replace the relatively complicated multiple processes of making staircase structures and word line contacts. That is, the two structures—staircase structure and word line contact, as well as their separate processes—can be merged into a single word line pick-structure in one process, thereby reducing the manufacturing cost and simplifying the process. Moreover, in some instances, by replacing staircase structures and word line contacts with word line pick-structures, the scope of the gate replacement process can be reduced, such that at least some of the dummy channel structures can be eliminated as well to further reduce the cost and simplify the process.

FIG. 1 illustrates a plan view of a 3D memory device 100 having word line pick-up structures 106, according to some implementations of the present disclosure. In some implementations, 3D memory device 100 is a NAND Flash memory device in which memory cells are provided in the form of an array of NAND memory strings. It is noted that x and y axes are included in FIG. 1 to illustrate two orthogonal (perpendicular) directions in the wafer plane. The x-direction is the word line direction of 3D memory device 100, and the y-direction is the bit line direction of 3D memory device 100.

As shown in FIG. 1, 3D memory device 100 can include one or more blocks 102 arranged in the y-direction (the bit line direction) separated by parallel slit structures 108, such as gate line structure slits (GLSs). In some implementations, e.g., in which 3D memory device 100 is a NAND Flash memory device, each block 102 is the smallest erasable unit of the NAND Flash memory device. Each block 102 can further include multiple fingers 104 in the y-direction separated by some of the parallel slit structures 108 with "H" cuts 109.

As shown in FIG. 1, 3D memory device 100 can be divided into at least a core array region 101 in which an array of channel structures 110 are formed, as well as a word line pick-up region 103 in which a plurality of word line pick-up structures 106 are formed. Core array region 101 and word line pick-up region 103 are arranged in the x-direction (the word line direction), according to some implementations. It is understood that although one core array region 101 and one word line pick-up region 103 are illustrated in FIG. 1, multiple core array regions 101 and/or multiple word line pick-up regions 103 may be included in 3D memory device 100. For example, one word line pick-up region 103 can be located between two core array regions 101 in the x-direction. In other examples, the word line pick-up region can be located on either or both sides of a single core array region. It is also understood that FIG. 1 only illustrates portions of core array region 101 that are adjacent to word line pick-up region 103.

As described below in detail, word line pick-up region 103 can include conductive portions 105 and dielectric portions 107 arranged in the y-direction. As shown in FIG. 1, the plurality of word line pick-up structures 106 are disposed in dielectric portion 107, while dummy channel structures 112 are disposed in a conductive portion 105 of the word line pick-up region 103 to provide mechanical support and/or load balancing, according to some implementations. In some implementations (e.g., as shown in FIG. 1), dummy channel structures 112 are disposed in the dielectric portion 107 of the word line pick-up region 103 as well, for example, dummy channel structures are disposed between word line pick-up structures 106 in the x-direction. In some implementations, dummy channel structures 112 are not disposed in dielectric portion 107 of word line pick-up region 103, i.e., dummy channel structures 112 are only disposed in the conductive portion 105 of word line pick-up region 103. As shown in FIG. 1, each finger 104 of the 3D memory device 100 can include one row of word line pick-up structures 106 disposed in dielectric portion 107 of word line pick-up region 103. In some implementations, each finger 104 can include more than one row of word line pick-up structures. For example, two rows of word line pick up structures are configured in a block arrangement in which each of the two rows proximate to a respective one of two gate line structures that divide the block. It is understood that the layout and arrangement of word line pick-up structures 106, as well as the shape of each word line pick-up structure 106, may vary in different examples and or embodiments.

Figure 2:
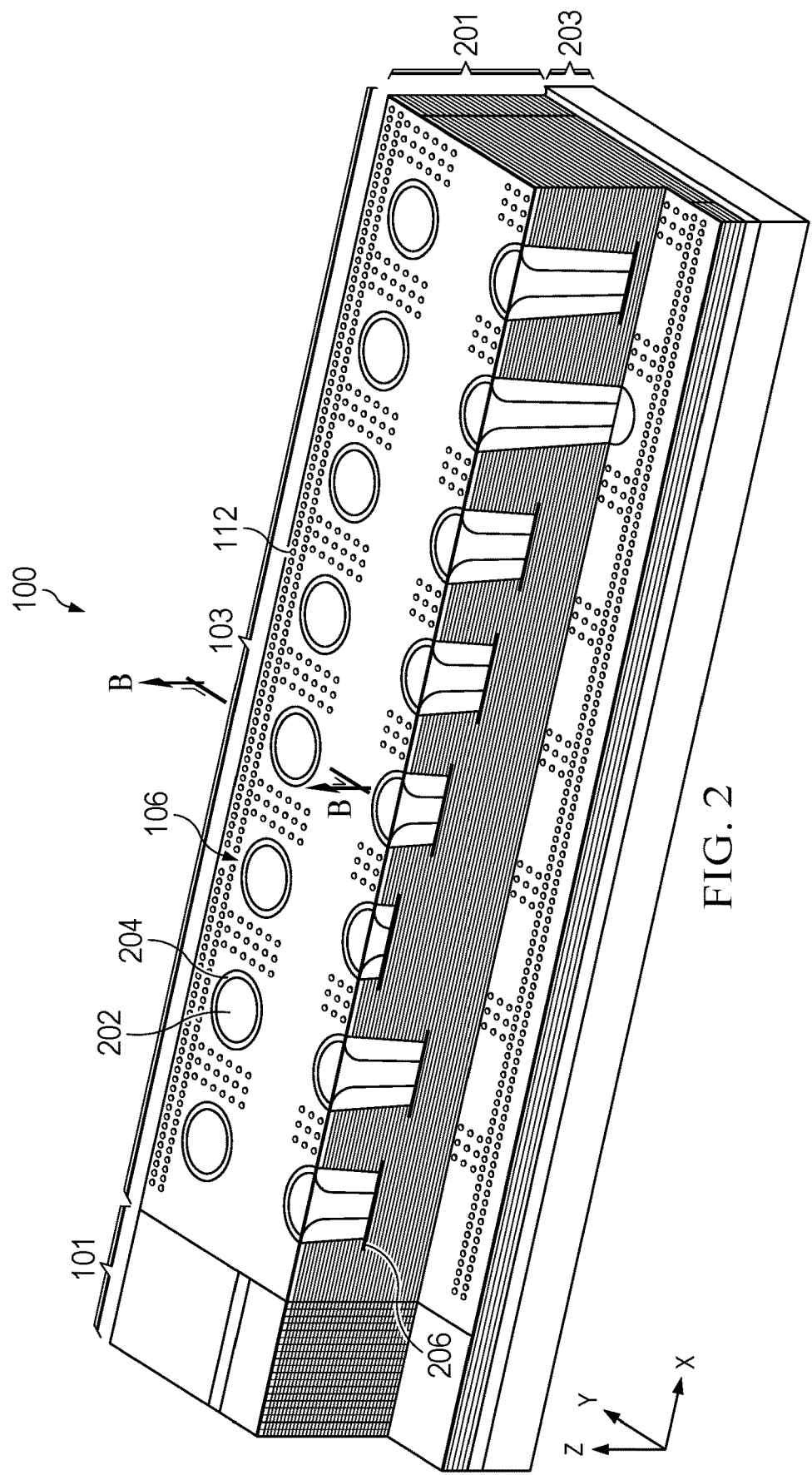
FIG. 2 illustrates a top perspective view of a 3D memory device having word line pick-up structures, according to some aspects of the present disclosure.
Figure 3:
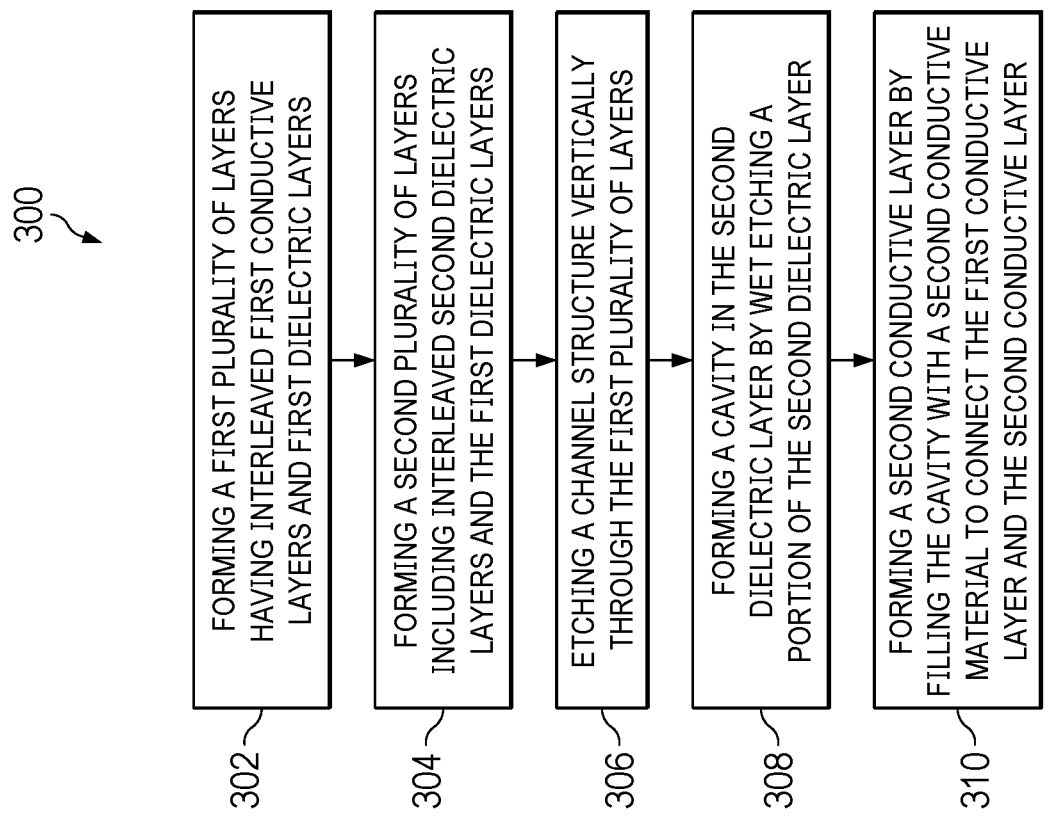
FIG. 3 shows a flow chart of an example method of forming the 3D memory device shown in FIGS. 1-2.
Figure 4:
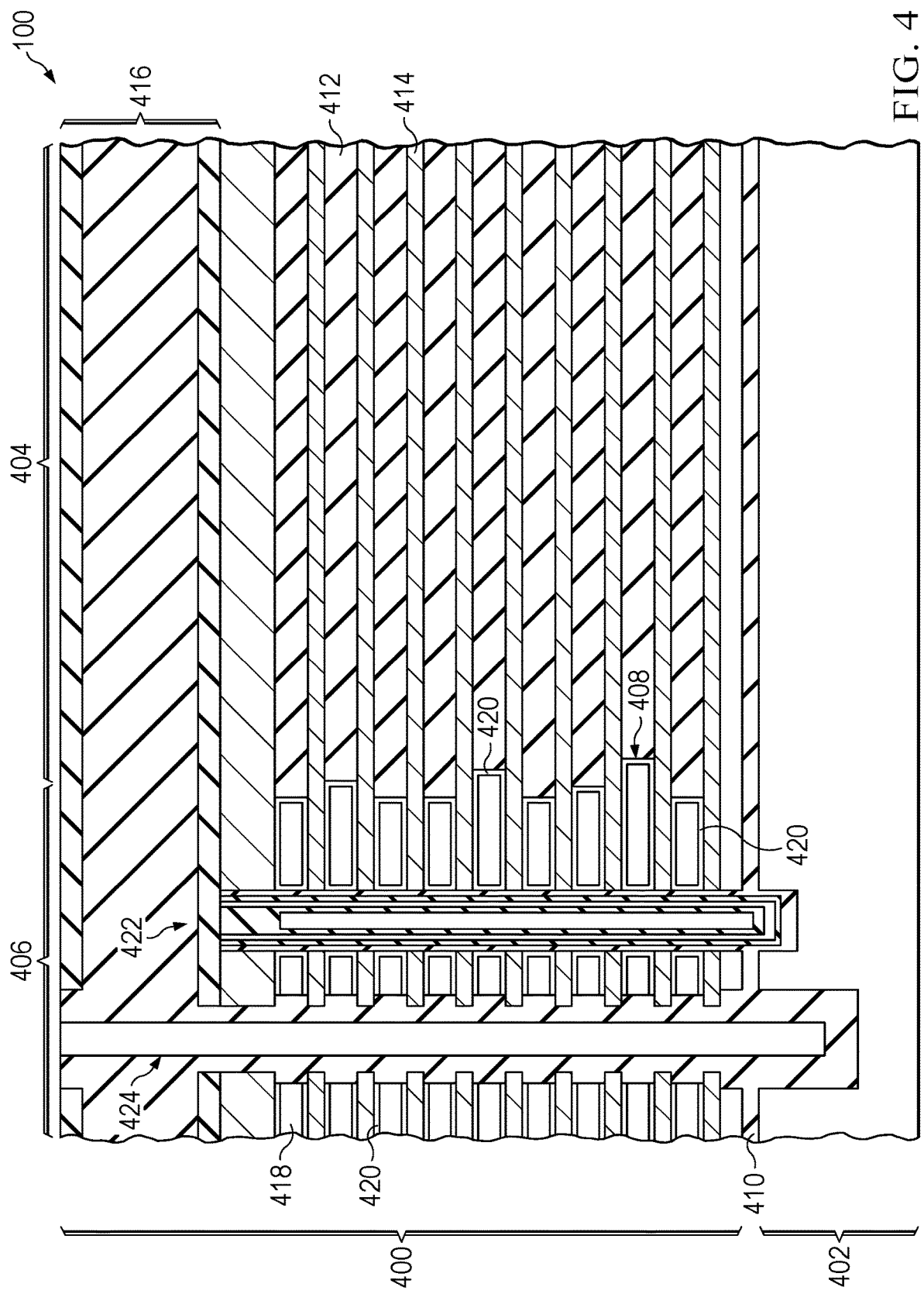
FIG. 4 illustrates a side view of a stack structure 400 having a plurality of interleaved layers.

FIG. 2 illustrates a top perspective view of 3D memory device 100 having word line pick-up structures 106, according to some aspects of the present disclosure. FIG. 3 shows a flow chart of an example method of forming the 3D memory device shown in FIGS. 1 and 2. illustrates an enlarged top perspective view of 3D memory device 100 having word line pick-up structures 106, according to some aspects of the present disclosure. As shown in FIGS. 1 and 2, a stacked structure 201 can be formed on a substrate 203, which can include silicon (e.g., single crystalline silicon), silicon germanium (SiGe), gallium arsenide (GaAs), germanium (Ge), silicon on insulator (SOI), or any other suitable materials. In some implementations, substrate 203 includes single crystalline silicon, which is part of the wafer on which 3D memory device 100 is fabricated, either in its native thickness or being thinned. In some implementations, substrate 203 includes, for example, polysilicon, which is a semiconductor layer replacing the part of wafer on which 3D memory device 100 is fabricated. It is noted that x, y, and z axes are included in FIGS. 1 and 2 to further illustrate the spatial relationship of the components in 3D memory device 100. Substrate 203 of 3D memory device 100 includes two lateral surfaces that each extend laterally in the x-y plane: a top surface on the front side of the wafer on which the stacked structure 201 can be formed, and a bottom surface on the backside opposite to the front side of the wafer. The z-axis is perpendicular to both the x and y axes. As used herein, whether one component (e.g., a layer or a device) is "on," "above," or "below" another component (e.g., a layer or a device) of 3D memory device 100 is determined relative to substrate 203 of 3D memory device 100 in the z-direction (the vertical direction perpendicular to the x-y plane) when substrate 203 is positioned in the lowest plane of 3D memory device 100 in the z-direction. The same notion for describing the spatial relationship is applied throughout the present disclosure. The line B-B shows the cross-section line of a word line structure 104, as illustrated in FIG. 4.

FIG. 3 depicts a flow chart of an example method of fabricating the stacked structure shown in FIG. 1. At operation 302, a film structure is provided, as shown in FIG. 4, which illustrates a side view of a stacked structure 400 having plural interleaved layers. The stacked structure 400 includes a staircase structure 404 and a core area 406 that converge at an interface 408. The stacked structure 400 is disposed over a substrate 402 having a first insulating material 410 disposed therebetween.

At operation 304, the staircase structure 404 includes a first dielectric layer 414 and second dielectric layer 412 that are interleaved through the stacked structure 400. One or more of a second insulating layer 416 is disposed over a topmost first dielectric layer 414. The first dielectric layer 414 includes an oxide, such as silicon oxide. The second dielectric layer 412 includes a nitride. In some examples, the second dielectric layer 412 is silicon nitride (SiN), titanium nitride (TiN), or any other suitable metallic nitride.

The core area 406 includes first conductive layers 418 interleaved with first dielectric layers 414. A high-k dielectric layer 420 may include for example an oxide material, and the high-k dielectric layer 420 circumscribes the first conductive layer 418. The high-k dielectric layer 420 and the second dielectric layer 412 contact one another at the interface 408. Because a length of second dielectric layer 412 and first conductive layer 418 can differ in each of the vertical rows of the stacked structure 400, a horizontal position of the interface 408 varies thorough the stacked structure 400, can depend on a given row of the stacked structure 400. In some implementations, the first conductive layer 418 can be tungsten or any other suitable other metal. In some implementations, the first conductive layer 418 can be TiN. In one example, the high-k dielectric layer is alumina.

In some examples, the core area 406 includes a dummy channel structure 422 and a gate line structure 424. The dummy channel structure 422 extends through the first dielectric layers 414 and the second dielectric layers 412 in the staircase structure 404 and the substrate 402 of the stacked structure 400. Dummy channel structure(s) 422 mechanically support the stacked structure 400 during the fabrication process. For example, should the first dielectric layer 414 be removed during processing, explained in greater detail below, the dummy channel structure 422 enables the second dielectric layer(s) 414 to retain their relative vertical and horizontal positions in the stack structure 400, thus, mechanically supporting the stack structure 400. Dummy channel structure 422 can have a cylinder shape (e.g., a pillar shape), in at least one example. However, other shapes are feasible without departing from the scope of this disclosure.

Figure 5A:
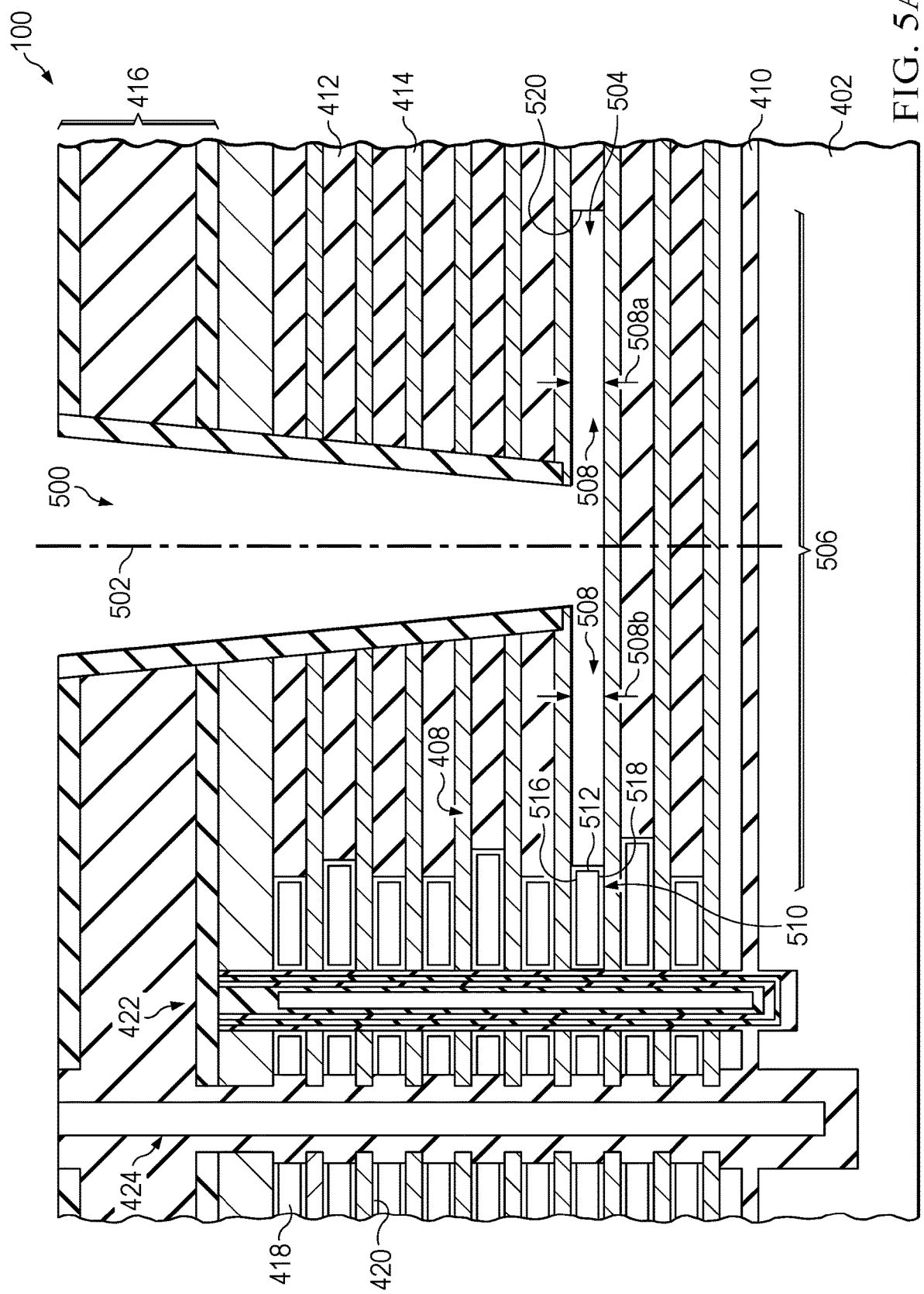
FIGS. 5A, 5B and 6-8 illustrate the stack structure 400 at various stages of processing during the method 300 illustrated in FIG. 3.

As shown in FIG. 5A, 3D memory device 100 can further include slit structures 108 across core array region 101. Each slit structure 108 can extend vertically through interleaved conductive layers 418 and first dielectric layers of the conductive stack structure of stack structure into substrate. The gate line structure 424 separates conductive layers 418 (word lines) between different blocks 102 (shown in FIG. 1). In some implementations, slit structure 108 is an insulating structure that does not include any contact therein (i.e., not functioning as the source contact) and thus, does not introduce parasitic capacitance and leakage current with conductive layers 418 (word lines). In some implementations, slit structure 108 is a front-side source contact further including a conductive portion (e.g., including W, polysilicon, and/or TiN). As described, during the gate replacement process, the slit in which slit structure 108 is formed can serve as the passageway and starting point for forming conductive layers 418. As a result, slit structure 108 is surrounded by conductive layers 418 in either core array region 101 or conductive portion of word line pick-up region 103.

Example fabrication processes for forming the hole of the gate line structure 424 include wet etching and/or dry etching, such as deep-ion reactive etching (DRIE). The film layers, such as the first and second dielectrics 412, 414, and the first and second insulating materials 410, 416 can be formed by one or more film deposition processes that include ALD, CVD, PVD, any other suitable processes, or any combination thereof. In addition, conductive layers, such as the first conductive layer 418, can be deposited using one or more thin film deposition process, such as ALD, CVD, PVD, any other suitable processes, or any combination thereof.

The first insulating material 410 extends horizontally between the staked structure 400 and the substrate. In some examples, the first insulating material 410 surrounds the gate line structure 424, such that a first terminal end of the gate line structure 424 is exposed through a top of the second insulating material 416. A second terminal end of the gate line structure 424, the end opposite the first terminal end, extends into the substrate 402, beneath a top surface of the gate line structure 424.

Continuing with operation 306, a vertical channel 500 is formed in the 3D memory device. The vertical channel 500 is formed through the first and second insulating materials 410 and 416. As illustrated in FIG. 5A, the stacked structure 400 has a vertical channel 500 formed through the plural interleaved layers. The vertical channel 500 extends through the first insulating material 410 and a portion of the stacked structure 400. In some implementations, the vertical channel 500 extends through a majority portion of the stacked structure 400. The vertical channel 500 is formed substantially isotopically, such that a sidewall of the vertical channel 500 is relatively symmetric about centerline 502 extending through a center of the vertical channel 500.

After forming the vertical channel 500 in-whole or in-part, a horizontal channel 504 is formed in the stacked structure 400 at a terminal end of the vertical channel 500. In one example, the horizontal channel 504 is substantially symmetric about the centerline 502, as shown in FIG. 5A. A length in a vertical direction and height 508 in a vertical direction are therefore substantially symmetric about the centerline 502. The horizontal channel 504, formed symmetrically, is formed by dry etching, such as by DRIE. Accordingly, the length 506 is substantially disposed in the staircase structure 404. In this example, the length 506 terminates at the interface 408. By using wet etching, the upper and lower interfaces of 504 are uniform, and the height of 504 is consistent, thereby avoiding the problem of poor WL to WL breakdown voltage.

Figure 5B:
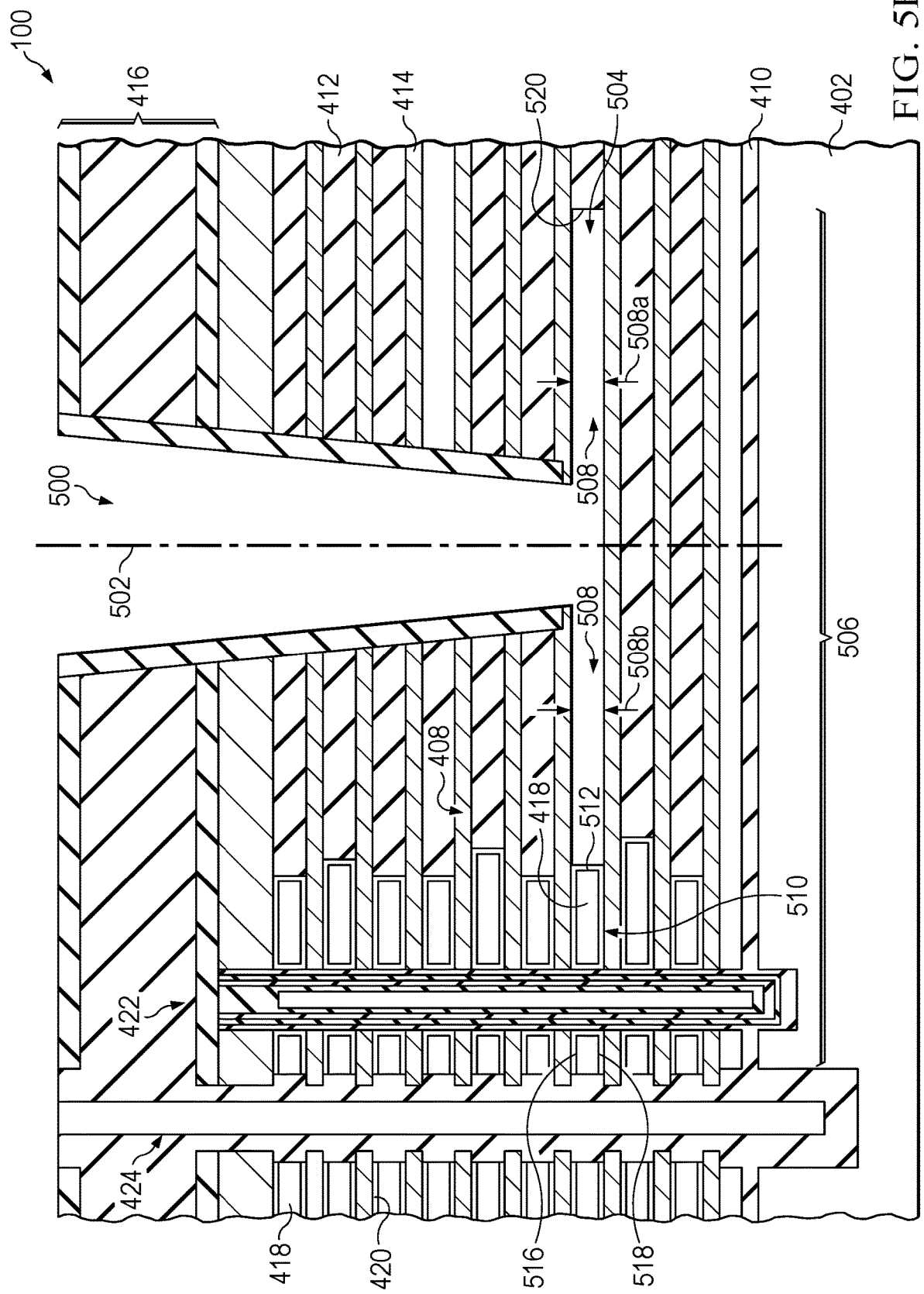

The first dielectric layer 414 is removed by etching along a length 506 of the horizontal channel 504. After removing the first dielectric layer 414, the high-k dielectric layer 420 is removed from a portion of the first conductive layer 418 at the interface 408. Accordingly, a vertical face 512 of the first conductive layer 418 proximate the interface 408 is exposed to an ambient environment within the 3D memory device 100. A gap 510 is formed between the first conductive layer 418 and the second dielectric layer 412 on both horizontal sides of the first conductive layer 418. As seen in FIGS. 5A-5B, the gap 510 ensures that a first surface 516 and a second surface 518, opposite the first surface 516, are exposed to the ambient environment. The ambient environment is the processing environment (e.g., gases, plasma, etc.) to which the vertical channel 500 and horizontal channel 504 are directly exposed. The gap 510 may extend a few microns in the horizontal direction.

In another example of operation 306, shown in FIG. 5B, the horizontal channel 504 is not symmetric about the centerline, such that the length 506 of the horizontal channel 504 is longer on one side of the centerline 514 than the opposite side of the centerline 514. The length 506 of the horizontal channel 504 extends laterally into the staircase structure 404 and the core area 406.

The high-k dielectric layer 420 is removed from the first conductive layer 418 in a portion of the core area 406, such that the horizontal channel 504 extends to the first insulating material 410 surrounding the gate line structure 424. Upon removal of the high-k dielectric layer 420, the first conductive layer 418 is thus exposed to the ambient environment. The height 508 of the horizontal channel 504 is substantially uniform in a direction proceeding away from or towards the centerline 502. By using wet etching instead of dry etching to directly remove SiN and HK, due to the selection ratio of etching solution corresponding to different materials (when compared to dry etching) wet etching can more effectively avoid damage to the oxide layer. This leads to the resulting uniformly etched surface.

Accordingly, the height 508 taken at the first location 508a, which is closer to the centerline 502, is substantially equal to the height 508 taken at a second location 508b that is further away from the centerline 502 than the first location 508a. The height 508 of the horizontal channel 504 is substantially similar to the thickness of the first dielectric layer 412 or the combined thicknesses of the high-k dielectric layer 420 and the first conductive layer 418. For example, the difference between the height 508 of the horizontal channel 504 and the thickness of the first dielectric layer 512 (or the combined thicknesses of the high-k dielectric layer 420 and the first conductive layer 418) is less than 20%, or preferably, less than 10%. Accordingly, the difference between the thickness of a second dielectric layer 412 adjacent to the horizontal channel 504 and the thickness of any one of the rest of second dielectric layers 412 is less than 10%, or preferably, less than 5%. The gap 510 extends horizontally from the interface 408 to the channel structure 422. Both of a vertical face 512, and the first surface 516 and the second surface 518, of the first conductive layer 418 are exposed to the ambient environment after the high-k dielectric layer 420 is removed. The length 506 of the horizontal channel 504 extends from a vertical sidewall 520 of the first dielectric layer 414 to the vertical face 512.

After etching, the processed portions of the first conductive layer 418 can be referred to as "hanging," since neither the high-k dielectric layer 420 nor the second dielectric layer 412 provide structural support for the post-processed portions of the first conductive layer 408. In this example, a wet etchant is used to form the horizontal channel 504. A dry etchant is used to form the vertical channel 500. An exemplary wet etchant is phosphoric acid, however other wet etchants are suitable, so long that the height 508 of the horizontal channel 504 is substantially uniform. Advantageously, the wet etchant removes the first dielectric layer 414, however, does not etch the second dielectric layer 412. Additionally, the high-k dielectric layer 420 that used to circumscribe the "hanging" portion of the first conductive layer 418 is etched during operation 308. In one example, phosphoric acid can be used as the wet etchant.

Figure 6:
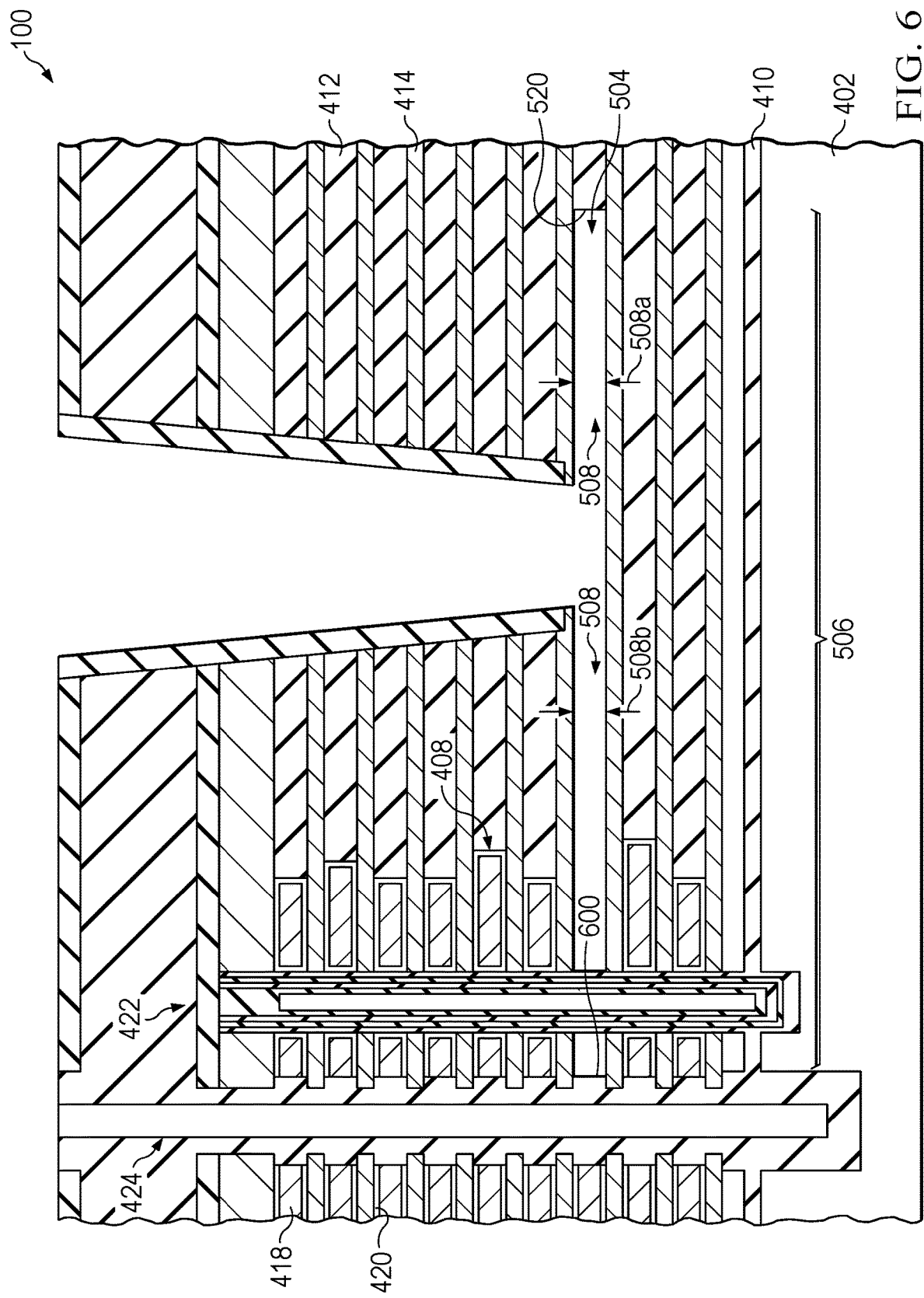

Proceeding to operation 308, the first conductive layer 418 in the staircase structure 404 is removed between the interface 408 and the gate line structure 424, as illustrated in FIG. 6. Accordingly, the "hanging" portion of the first conductive layer 418 shown in FIG. 5B is removed. Accordingly, the length 506 of the horizontal channel 504 extends from the vertical sidewall 520 of the first dielectric layer 414 to a vertical sidewall 600 of the gate line structure 424, and is void of any high-k material. The height 508 is substantially uniform throughout the horizontal channel 504.

In some implementations, a few microns of the second dielectric layer 412 are etched prior to removing the "hanging" portion of the first conductive layer 418, further ensuring that the first dielectric layer 414 is removed. Etching the second dielectric layer 412 also enables the second conductive layer 700 to come into contact with the second dielectric layer 412, as described below. The "hanging" portion of the first conductive layer 418 may be removed by a dry etchant, in one example. In another implementation, a wet etchant removes the "hanging" portion of the first conductive layer 418. In some implementations, the wet etchant is an acid.

Figure 7:
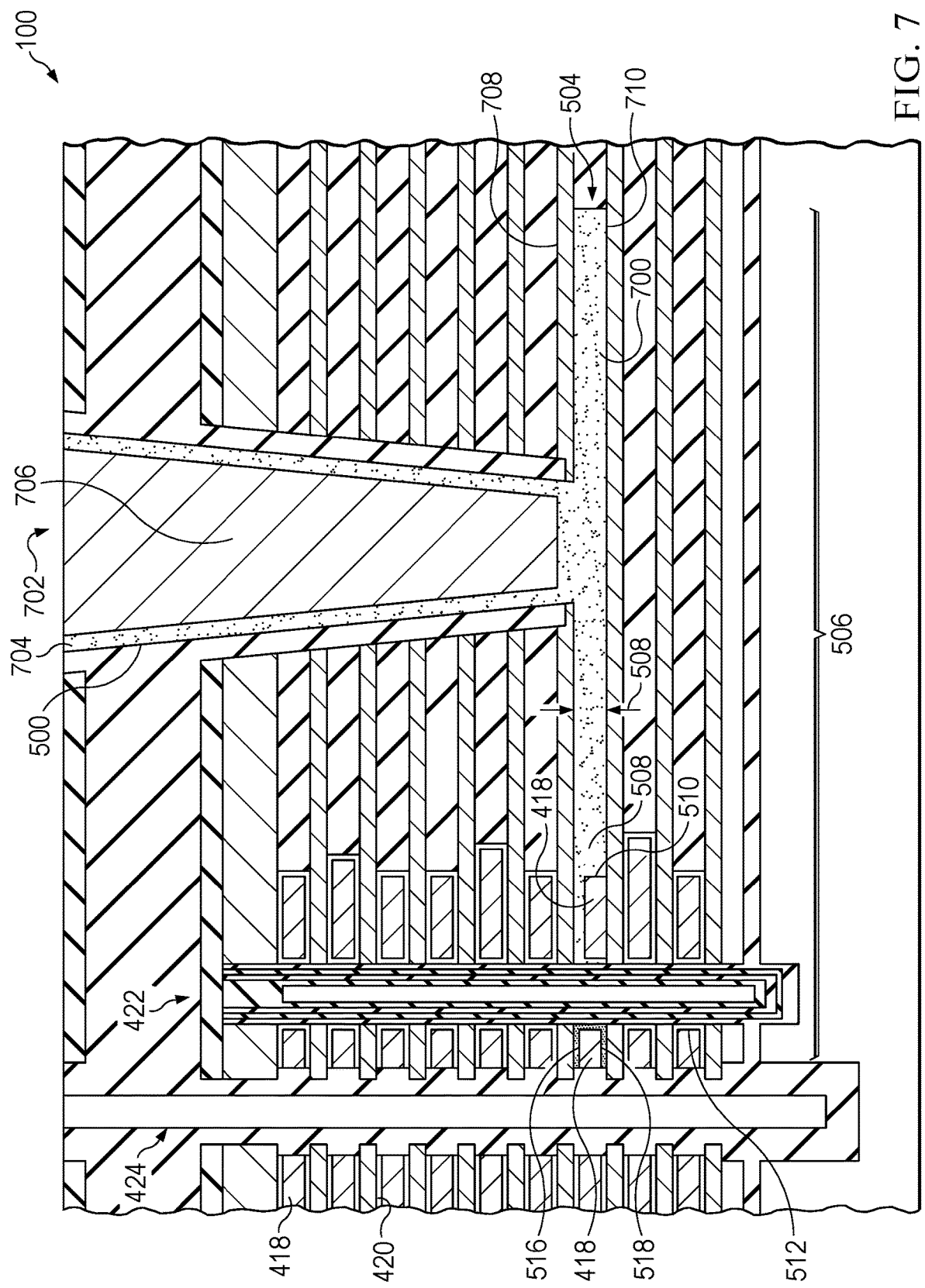

Proceeding to operation 310, shown in FIG. 7, one or more conductive layers 700, 702 are deposited in the vertical channel 500 and horizontal channel 504. The 3D memory device 100 shown in FIG. 5A or 5B can be filled with the second conductive layer 700 and third conductive layer 702, as described below.

A second conductive layer 700 is disposed in the horizontal channel 504. The second conductive layer 700 overlays and is in contact with the sidewalls of the vertical channel 500, such that the second conductive layer 700 disposed in the vertical channel 500 is in contact with and electrically coupled to the 700 disposed in the 504. A perimeter portion 704 of the second conductive layer 700 is formed on an internal perimeter of the vertical channel 500. The third conductive layer 702 is formed over the second conductive layer 700 and within the perimeter portion 704 of the second conductive layer 700. The third conductive layer 702 has a flat surface 706 that is parallel to the perimeter portion 704. In one example, the perimeter portion 704 has a circular shape, forming a toroid. Accordingly, the flat surface 706 has a corresponding circular shape, forming a circle or oval. In another example, the perimeter portion 704 has a rectangular shape, as such, the flat surface 706 has a corresponding rectangular shape, such as a square or rectangle.

As previously described, the gap 510 extends from the interface 408 to the gate line structure 424, exposing the first surface 516 and second surface 518. The second conductive layer 700 fills an entirety of the horizontal channel 504 up to the dummy channel structure 422. As such, the second conductive layer 700 fills the gap 510 and contacts the first surface 516, second surface 518, and vertical face 512 of the first conductive layer 418. On an opposite side of the 3D memory device 100 as the interface 408 in the staircase structure 404, the second conductive layer 700 is in contact with and terminates at the vertical sidewall 520 of the first dielectric layer 414. As shown, an upper side 710 and lower side 712 of the second conductive layer 700 in the horizontal channel 504 are in contact with the second dielectric layer 412. In this manner, the second conductive layer 700 is insulated on the upper and lower sides 710, 712.

A portion of the gap 510, closest to the gate line structure 424, is not filled with the second conductive layer 700. One advantage of not filling an entirety of the gap 510 with the second conductive layer 700 is that less processing time and materials are required to make the electrical connections between the first and second conductive layers 418, 700. Accordingly, in some implementations, the 3D memory device 100, as shown in FIG. 7, can be fabricated at lower costs than the 3D memory device 100 having an entirety of the gap 510 filled with the second conductive layer 700. In some implementations, the second conductive layer 700 is formed from tungsten.

Figure 8:
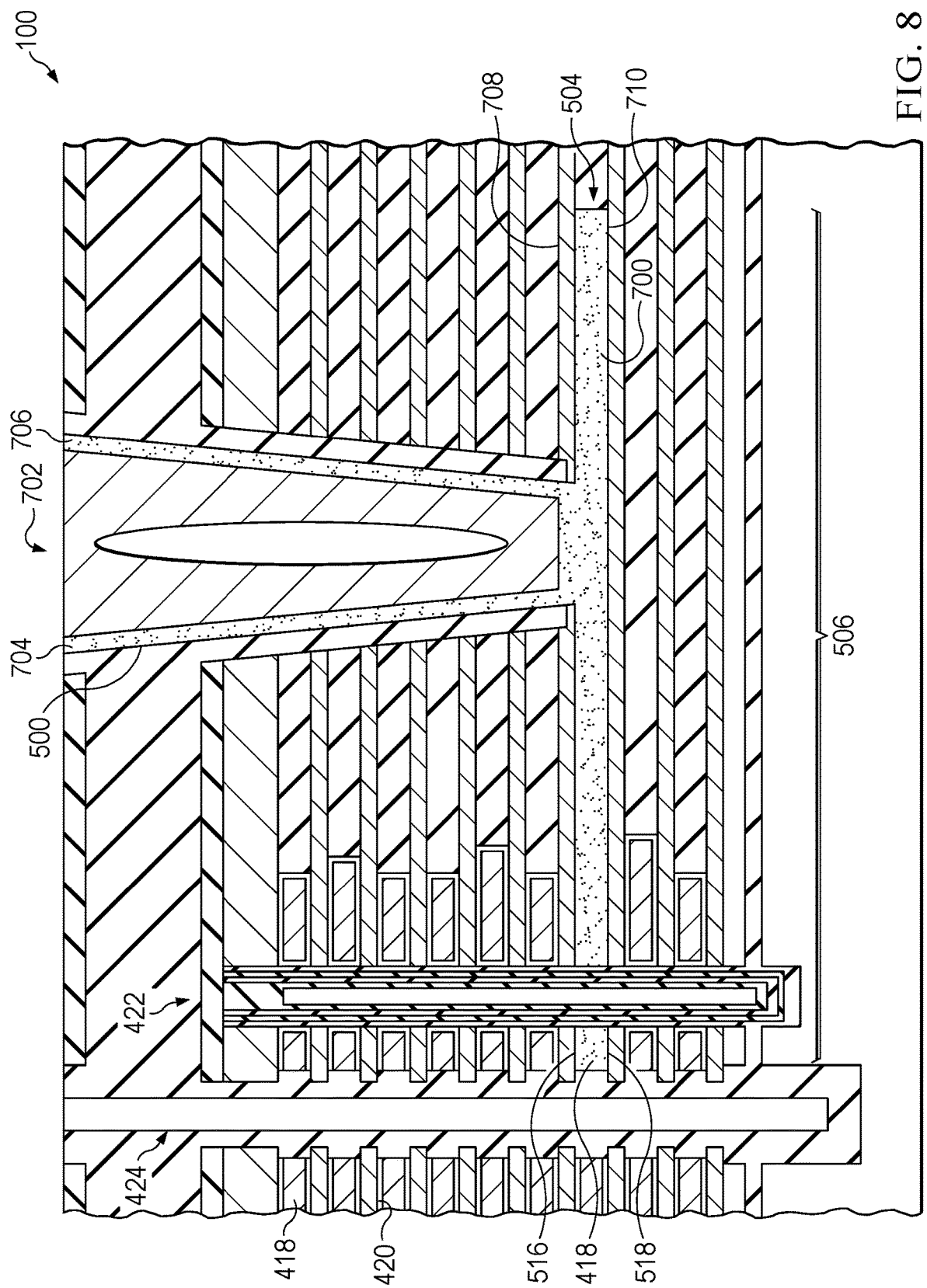

In a second example, shown in FIG. 8, the stacked structure having one or more conductive structures disposed in the opening and a portion of the vertical channel. In this example, the "hanging" portion of the first conductive layer 418 is removed, as described above. The "hanging" portion of the first conductive layer 418 can be removed with an acid. The horizontal channel 504 extends from the vertical sidewall 520 of the first dielectric layer 414 to the vertical sidewall 600 of the gate line structure 424. The second conductive layer 700 is deposited, filling the horizontal channel 504. Accordingly, the second conductive layer 700 is in direct physical and electrical contact with the first conductive layer 418. In some implementations, the second conductive layer 700 is in direct physical and electrical contact with the gate line structure 424.

As described above with respect to FIG. 7, the third conductive layer 702 is deposited over the second conductive layer 700, creating a signal path between the write-line (WL) and the second and third conductive layers 700, 702. One advantage of this implementation is increased integrity of the conductive layers extending from the write line leading out of the 3D memory device 100.

FIG. 9 illustrates a block diagram of a system 900 having a 3D memory device, according to some implementations of the present disclosure. The system 900 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 9, the system 900 can include a host 908 and a memory system 902 having one or more 3D memory devices 904 and a memory controller 906. Host 908 can be a processor of an electronic device, such as a central processing unit (CPU), or a system-on-chip (SoC), such as an application processor (AP). Host 908 can be configured to send or receive data to or from 3D memory devices 904.

3D memory device 904 can be any 3D memory device disclosed herein, such as 3D memory device 100 depicted in FIGS. 1-4, 5A, 5B, 6A, and 6B. In some implementations, each 3D memory device 904 includes a NAND Flash memory. Consistent with implementations of the present disclosure, word line pick-up structures can replace the staircase structures and word line contacts to achieve word line pick-up/fan-out functions, thereby reducing the manufacturing cost and simplifying the fabrication process.

Memory controller 906 (a.k.a., a controller circuit) is coupled to 3D memory device 904 and host 908 and is configured to control 3D memory device 904, according to some implementations. For example, memory controller 906 may be configured to operate the plurality of channel structures via the word lines. Memory controller 906 can manage the data stored in 3D memory device 904 and communicate with host 908. In some implementations, memory controller 906 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 906 is designed for operating in a high duty cycle environment SSDs or embedded multi-media-cards (eMMCs) used as data storage for mobile devices, such as smartphones, tablets, laptop computers, etc., and enterprise storage arrays. Memory controller 906 can be configured to control operations of 3D memory device 904, such as read, erase, and program operations. Memory controller 906 can also be configured to manage various functions with respect to the data stored or to be stored in 3D memory device 904 including, but not limited to bad-block management, garbage collection, logical-to-physical address conversion, wear leveling, etc. In some implementations, memory controller 906 is further configured to process error correction codes (ECCs) with respect to the data read from or written to 3D memory device 904. Any other suitable functions may be performed by memory controller 906 as well, for example, formatting 3D memory device 904.

Memory controller 906 can communicate with an external device (e.g., host 908) according to a particular communication protocol. For example, memory controller 906 may communicate with the external device through at least one of various interface protocols, such as a USB protocol, an MMC protocol, a peripheral component interconnection (PCI) protocol, a PCIexpress (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Memory controller 906 and one or more 3D memory devices 904 can be integrated into various types of storage devices, for example, be included in the same package, such as a universal Flash storage (UFS) package or an eMMC package. That is, memory system 902 can be implemented and packaged into different types of end electronic products. In one example as shown in FIG. 9, memory controller 906 and a single 3D memory device 904 may be integrated into a memory card 902. Memory card 902 can include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc.

The foregoing description of the specific implementations can be readily modified and/or adapted for various applications. Therefore, such adaptations and modifications are intended to be within the meaning and range of equivalents of the disclosed implementations, based on the teaching and guidance presented herein.

Embodiments of the subject matter and the actions and operations described in this specification can be implemented in digital electronic circuitry, in tangibly-embodied computer software or firmware, in computer hardware, including the structures disclosed in this specification and their structural equivalents, or in combinations of one or more of them. Embodiments of the subject matter described in this specification can be implemented as one or more computer programs, e.g., one or more modules of computer program instructions, encoded on a computer program carrier, for execution by, or to control the operation of, data processing apparatus. The carrier may be a tangible non-transitory computer storage medium. Alternatively, or in addition, the carrier may be an artificially-generated propagated signal, e.g., a machine-generated electrical, optical, or electromagnetic signal, that is generated to encode information for transmission to suitable receiver apparatus for execution by a data processing apparatus. The computer storage medium can be or be part of a machine-readable storage device, a machine-readable storage substrate, a random or serial access memory device, or a combination of one or more of them. A computer storage medium is not a propagated signal.

While this specification contains many specific implementation details, these should not be construed as limitations on the scope of what is being claimed, which is defined by the claims themselves, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially be claimed as such, one or more features from a claimed combination can in some cases be excised from the combination, and the claim may be directed to a sub-combination or variation of a sub-combination.

Similarly, while operations are depicted in the drawings and recited in the claims in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the embodiments described above should not be understood as requiring such separation in all embodiments, and it should be understood that the described program components and systems can generally be integrated together in a single software product or packaged into multiple software products.

Particular embodiments of the subject matter have been described. Other embodiments also are within the scope of the following claims. For example, the actions recited in the claims can be performed in a different order and still achieve desirable results. As one example, the processes depicted in the accompanying figures do not necessarily require the particular order shown, or sequential order, to achieve desirable results. In some cases, multitasking and parallel processing may be advantageous.

The breadth and scope of the present disclosure should not be limited by any of the above-described exemplary implementations, but should be defined only in accordance with the following claims and their equivalents.

What is claimed is:

1. A memory device, comprising:
   first layers including word lines interleaved respectively with first dielectric layers;
   at least one gate line structure penetrating through the first layers;
   second layers including second dielectric layers interleaved respectively with the first dielectric layers, wherein the second layers are adjacent to the first layers; and
   word line pick-up structures each of which comprises a vertical contact extending through the second layers and an interconnect line connecting to the vertical contact, wherein each interconnect line extends from a closest gate line structure of the at least one gate line structure in a direction of and is in contact with a different one of the word lines, and wherein at least a portion of each of the word lines is at least partially circumscribed by high dielectric constant gate dielectric (high-k) material and the interconnect line is not circumscribed by the high-k material.

2. The memory device of claim 1, wherein the at least a portion of the different one of the word lines that is partially circumscribed by the high-k material is located on a different side of the closest gate line structure with the word line pick-up structures, and wherein a remainder portion of the different one of the word lines is in contact with a respective interconnect line and located on a same side of the closest gate line structure with the word line pick-up structures.

3. The memory device of claim 2, wherein at least a portion of the respective interconnect line is sandwiched between the remainder portion of the different one of the word lines and a respective one of the first dielectric layers.

4. The memory device of claim 1, wherein the different one of the word lines in contact with a respective interconnect line is located on a different side of the closest gate line structure with the word line pick-up structures.

5. The memory device of claim 1, wherein a thickness of each of the first dielectric layers are substantially the same.

6. The memory device of claim 1, wherein each interconnect line has substantially a same thickness as a respective one of the second dielectric layers it is in contact with.

7. The memory device of claim 1, wherein the second dielectric layers are sacrificial layers.

8. The memory device of claim 1, wherein the word line pick-up structures and the word lines comprise a same conductive material.

9. The memory device of claim 1, wherein word line pick-up structures comprise one or more conductive materials.

10. The memory device of claim 9, wherein the one or more conductive materials comprise a material of the word lines.

11. The memory device of claim 1, wherein each of the first dielectric layers comprises oxide material and each of the second dielectric layers comprises nitride material.

12. A system comprising:
a memory device configured to store data, the memory device comprising:
first layers including word lines interleaved respectively with first dielectric layers;
at least one gate line structure penetrating through the first layers;
second layers including second dielectric layers interleaved respectively with the first dielectric layers, wherein the second layers are sandwiched in the first layers; and
word line pick-up structures each of which comprises a vertical contact extending through the second layers and an interconnect line connecting to the vertical contact, wherein each interconnect line extends from a closest gate line structure of the at least one gate line structure in a direction of and is in contact with a different one of the word lines, and wherein at least a portion of each of the word lines is at least partially circumscribed by high dielectric constant gate dielectric (high-k) material and the interconnect line is not circumscribed by the high-k material, and
a memory controller that electrically connects to and controls the memory device.

13. The system of claim 12, wherein the at least a portion of the different one of the word lines that is partially circumscribed by the high-k material is located on a different side of the closest gate line structure with the word line pick-up structures, and wherein a remainder portion of the different one of the word lines is in contact with a respective interconnect line and located on a same side of the closest gate line structure with the word line pick-up structures.

* * * * *